(12) United States Patent
Gao et al.

(10) Patent No.: US 11,424,258 B2
(45) Date of Patent: Aug. 23, 2022

(54) FLASH AND FABRICATING METHOD OF THE SAME

(71) Applicant: UNITED MICROELECTRONICS CORP., Hsin-Chu (TW)

(72) Inventors: Xiaojuan Gao, Singapore (SG); Chi Ren, Singapore (SG)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 26 days.

(21) Appl. No.: 17/177,211

(22) Filed: Feb. 17, 2021

(65) Prior Publication Data

US 2022/0238542 A1 Jul. 28, 2022

(30) Foreign Application Priority Data

Jan. 22, 2021 (CN) .......................... 202110086650.2

(51) Int. Cl.
| | | |
|---|---|---|
| H01L 21/00 | (2006.01) | |
| H01L 27/11531 | (2017.01) | |
| H01L 27/11524 | (2017.01) | |
| H01L 29/66 | (2006.01) | |
| H01L 29/788 | (2006.01) | |
| H01L 27/11529 | (2017.01) | |

(52) U.S. Cl.
CPC .. *H01L 27/11531* (2013.01); *H01L 27/11524* (2013.01); *H01L 27/11529* (2013.01); *H01L 29/66825* (2013.01); *H01L 29/788* (2013.01)

(58) Field of Classification Search
CPC ......... H01L 27/11531; H01L 27/11524; H01L 27/11529; H01L 29/66825; H01L 29/788
See application file for complete search history.

(56) References Cited

U.S. PATENT DOCUMENTS

| | | | |
|---|---|---|---|
| 9,431,256 B2 * | 8/2016 | Hsu ................... | H01L 27/11521 |
| 9,627,392 B2 | 4/2017 | Chuang | |
| 9,812,460 B1 | 11/2017 | Wu | |
| 9,837,425 B2 * | 12/2017 | Chen ................. | H01L 29/42328 |
| 10,192,874 B2 * | 1/2019 | Yi ..................... | H01L 27/11524 |
| 10,276,587 B2 | 4/2019 | Wu | |
| 11,056,495 B2 * | 7/2021 | Yi ..................... | H01L 27/11521 |
| 2006/0068529 A1 | 3/2006 | Chen | |
| 2019/0148513 A1 | 5/2019 | Lin | |

* cited by examiner

*Primary Examiner* — Richard A Booth
(74) *Attorney, Agent, or Firm* — Winston Hsu

(57) ABSTRACT

A flash includes a substrate. Two gate structures are disposed on the substrate. Each of the gate structures includes a floating gate and a control gate. The control gate is disposed on the floating gate. An erase gate is disposed between the gate structures. Two word lines are respectively disposed at a side of each of the gate structures. A top surface of each of the word lines includes a first concave surface and a sharp angle. The sharp angle is closed to a sidewall of the word line which the sharp angle resided. The sidewall is away from each of the gate structures. The shape angle connects to the first concave surface.

7 Claims, 2 Drawing Sheets

FLASH AND FABRICATING METHOD OF THE SAME

BACKGROUND OF THE INVENTION

1. Field of the Invention

The present invention relates to a flash with word lines formed by a self-aligned process and method of fabricating the flash.

2. Description of the Prior Art

Flash is a kind of non-volatile memory that can store the information without an external power supply. In recent years, flash has been widely used in electronic products such as mobile phones, digital cameras, game consoles, personal digital assistants, system on a chip (SOC) because of its advantages such as rewritable and electronically erasable.

However, word lines of a flash are defined by using photoresist in current fabricating method. However, because the lithographic tool has inevitable offset, the position of the photoresist is deviated and a width of each of the word lines is inconsistent with each other.

SUMMARY OF THE INVENTION

In view of this, the present invention defines word lines by a self-aligned process to make a width of each of the word lines to be consistent with each other.

According to a preferred embodiment of the present invention, a flash includes a substrate. Two gate structures are disposed on the substrate, each of the two gate structures includes a floating gate and a control gate, and the control gate is disposed on the floating gate. An erase gate is disposed between the two gate structures. Two word lines are disposed on the substrate, wherein one of the two word lines is disposed at a side of one of the two gate structures, and the other one of the two word lines is disposed at a side of the other one of the two gate structures. A top surface of each of the two word lines incudes a first concave surface and a sharp angle, the sharp angle is closed to a sidewall of the word line where the sharp angle is disposed, the sidewall is away from the two gate structures and the shape angle connects to the first concave surface.

According to another preferred embodiment of the present invention, a fabricating method of a flash includes providing a substrate, wherein two gate structures are disposed on the substrate. Later, a conductive layer is conformally formed to cover the gate structures and the substrate, wherein the conductive layer includes a first mountain-like profile, a second mountain-like profile, a first flat profile and a second flat profile, the first mountain-like profile connects to the second mountain-like profile, the first flat profile is at one side of the first mountain-like profile, the second flat profile is at one side of the second mountain-like profile, the first mountain-like profile and the second mountain-like profile respectively cover one of the two gate structures, the first flat profile and the second flat profile cover the substrate, the first mountain-like profile and the second mountain-like profile respectively include a summit and two slopes. After that, a sacrifice layer is formed to conformally cover the conductive layer. Subsequently, a first anisotropic etching process is performed to remove the sacrifice layer on the summit of the first mountain-like profile, on the summit of the second mountain-like profile, on the first flat profile and on the second flat profile, and the sacrifice layer on the two slopes of the first mountain-like profile and on the two slopes of the second mountain-like profile are remained. After the first anisotropic etching process, a second anisotropic etching process is performed to etch the conductive layer and the sacrifice layer until the first flat profile and the second flat profile are entirely removed.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 4 depict a fabricating method of a flash according to a preferred embodiment of the present invention, wherein:

FIG. 1 depicts a substrate with two gate structures thereon;

FIG. 2 is a fabricating stage following FIG. 1;

FIG. 3 is a fabricating stage following FIG. 2; and

FIG. 4 is a fabricating stage following FIG. 3.

DETAILED DESCRIPTION

FIG. 1 to FIG. 4 depict a fabricating method of a flash according to a preferred embodiment of the present invention.

Figure 1:
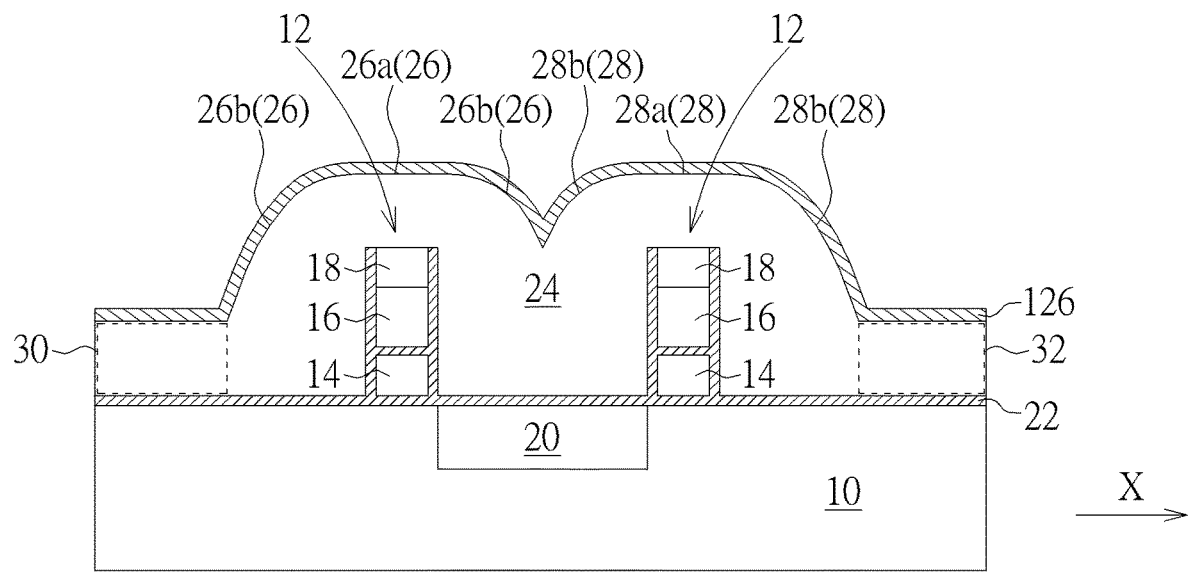

As shown in FIG. 1, a substrate 10 is provided. Two gate structures 12 are disposed on the substrate 10. Each of the gate structures 12 respectively includes a floating gate 14, a control gate 16 and a hard mask 18. The control gate 16 is disposed on the floating gate 14. The hard mask 18 is disposed on the control gate 16. A doping region 20 is disposed in the substrate 10 between the two gate structures 12. The doping region 20 will serve as a source line after the flash of the present invention is completed. An insulating layer 22 covers the substrate 10. The insulating layer 22 is disposed between the gate structures 12 and the substrate 10. Moreover, the insulating layer 22 is also disposed between the control gate 16 and the floating gate 14, and at two sidewalls of each of the gate structures 12. Later, a conductive layer 24 conformally covers each of the gate structures 12 and the substrate 10. The conductive layer 24 is preferably doped polysilicon. The gate structures 12 form two protruding profiles on the substrate 10; therefore when the conductive layer 24 conformally covers the gate structures 12 and the substrate 10, the conductive layer 24 form a first mountain-like profile 26, a second mountain-like profile 28, a first flat profile 30 and a second flat profile 32. The positions of the first flat profile 30 and the second flat profile 32 are marked by dotted lines in FIG. 1 and FIG. 2. The first mountain-like profile 26 connects to the second mountain-like profile 28. The first flat profile 30 is at one side of the first mountain-like profile 26 and connects to the first mountain-like profile 26. The second flat profile 32 is at one side of the second mountain-like profile 28 and connects to second flat profile 32. The first mountain-like profile 26 and the second mountain-like profile 28 respectively cover one of the gate structures 12. The first flat profile 30 and the second flat profile 32 cover the substrate 10. The first mountain-like profile 26 includes a summit 26a and two slopes 26b. The second mountain-like profile 28 includes a summit 28a and two slopes 28b. The first mountain-like profile 26 does not overlap the second mountain-like profile 28. The first flat profile 30 and the second flat profile 32 both cover the substrate 10. One of the slopes 26b of the first mountain-like profile 26 connects to one of the slopes 28b of the second mountain-like profile 28. The first flat profile 30 connects to another slope 26b of the first mountain-like profile 26. The second flat profile 32 connects to another slope 28b of the second mountain-like profile 28. A top surface of the first flat profile 30, a top surface of the second flat profile 32 and a top surface of the substrate 10 are parallel to each other. According to a preferred embodiment of the present invention, a thickness of the conductive layer 24 is between 500 angstroms and 1500 angstroms. Next, a sacrifice layer 126 is formed to cover the conductive layer 24 conformally. The sacrifice layer 126 includes silicon oxide or silicon nitride. According to a preferred embodiment of the present invention, a thickness of the sacrifice layer 126 is between 30 angstroms and 300 angstroms.

Figure 2:
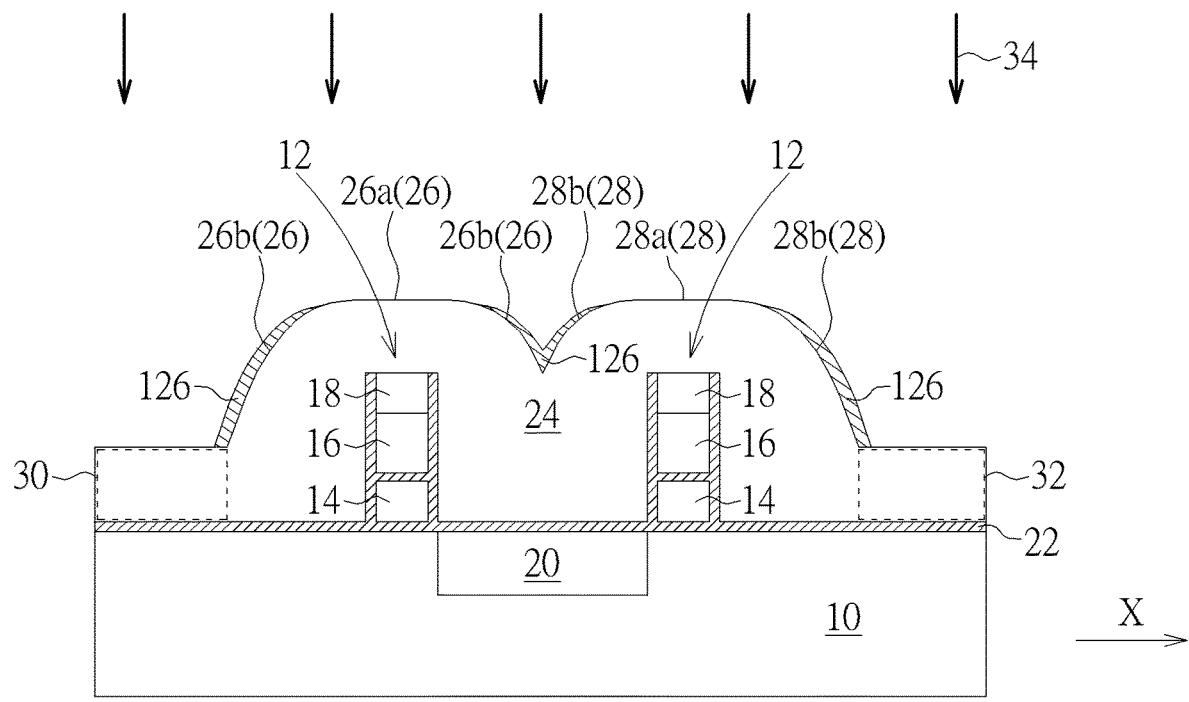

As shown in FIG. 2, a first anisotropic etching process 34 is performed to remove the sacrifice layer 126 on the summit 26a of the first mountain-like profile 26, on the summit 28a of the second mountain-like profile 28, on the first flat profile 30 and on the second flat profile 32. The sacrifice layer 126 on the two slopes 26b of the first mountain-like profile 26 and on the two slopes 28b of the second mountain-like profile 28 is remained. Briefly speaking, the sacrifice layer 126 along a horizontal direction X is removed by the first anisotropic etching process 34. The first anisotropic etching process 34 is preferably a dry etching process. The horizontal direction X is parallel to a top surface of the substrate 10.

Figure 3:
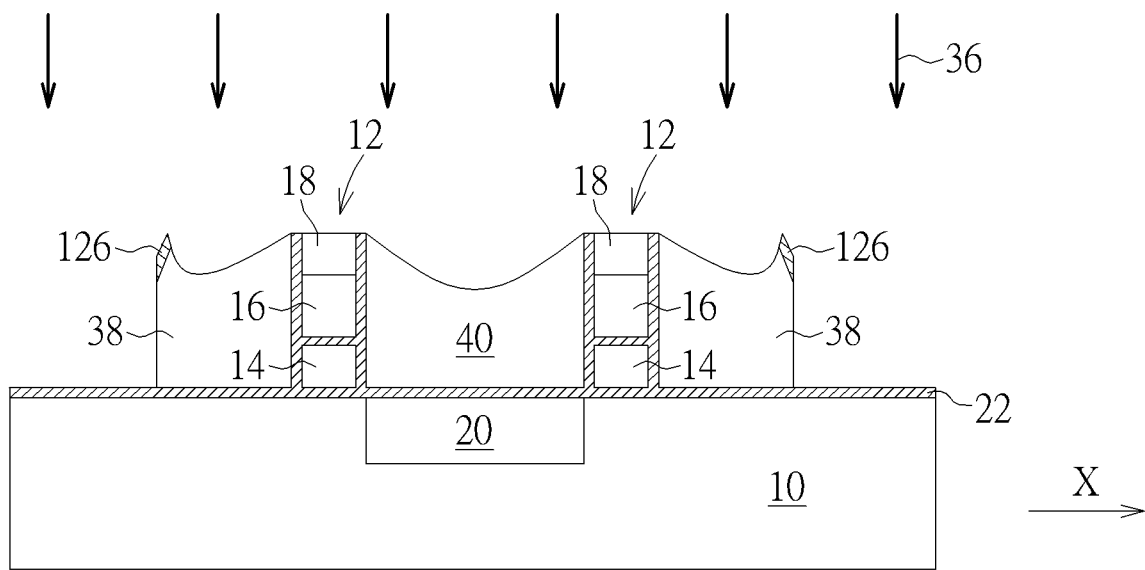

As shown in FIG. 3, a second anisotropic etching process 36 is performed to etch the conductive layer 24 and the sacrifice layer 126 and the second anisotropic etching process 36 is stopped when the first flat profile 30 and the second flat profile 32 are entirely removed. After the second anisotropic etching process 36 is stopped, a top surface of each of the gate structures 12 is exposed. In other words, the hard mask 18 is exposed. It is noteworthy that when the conductive layer 24 is etched, the conductive layer 24 of the slopes 26b/28b is etched later then the conductive layer 24 at other positions because the conductive layer 24 of the slopes 26b/28b is covered by the sacrifice layer 126. During the second anisotropic etching process 36, the sacrifice layer 126 needs to be removed in advance. Then, the conductive layer 24 of the slopes 26b/28b can be removed. On the other hand, the conductive layer 24 of the summits 26a/26b is not covered by the sacrifice layer 126, therefore the conductive layer 24 of the summits 26a/26b, of the first flat profile 30 and of the second flat profile 32 is etched from the very beginning of the second anisotropic etching process 36. In this way, during the same etching time, the conductive layer 24 of the slopes 26b/28b is etched less, and the conductive layer 24 of the summits 26a/26b, of the first flat profile 30 and of the second flat profile 32 is etched more. When the first flat profile 30 and the second flat profile 32 are entirely removed, some conductive layer 24 of the slopes 26b/28b still remains. The remaining conductive layer 24 is separated into three conductive pieces which do not connect to each other, the three conductive pieces respectively serve as two word lines 38 and an erase gate 40. One of the word lines 38 is disposed at a side of one of the gate structures 12, and the other one of the word lines 38 is disposed at a side of the other one of the gate structures 12. Because the sacrifice layer 126 influences the etched thickness of the conductive layer 24, the thickness of the sacrifice layer 126 can be adjusted to control the widths of the word lines 38.

Figure 4:
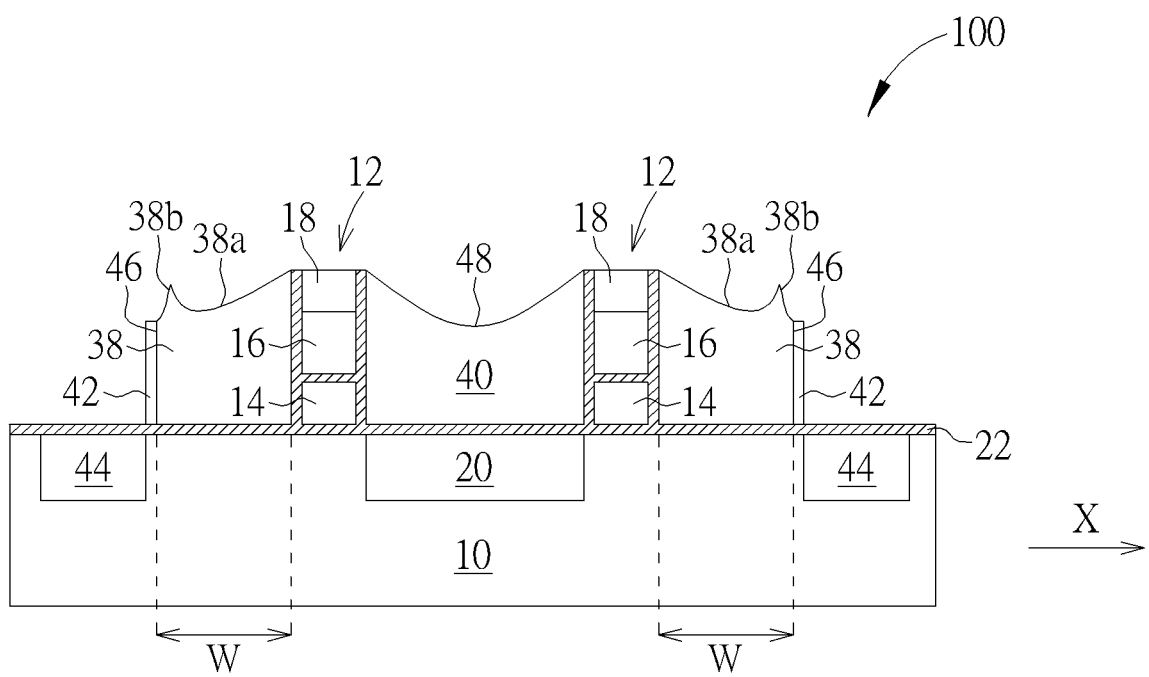

As shown in FIG. 4, the sacrifice layer 126 is entirely removed. At this point, a top surface of each of the word lines 38 includes a concave surface 38a and a sharp angle 38b. The concave surface 38a connects to the sharp angle 38b, and the sharp angle 38b is at a position away from the gate structures 12. Next, a spacer 42 is formed on a sidewall 46 of each of the gate structures 38. After that, a doping region 44 is formed within the substrate 10 which is at one side of each of the word lines 38 away from the erase gate 40. Now, a flash 100 of the present invention is completed. The doping region 44 serves as a bit line of the flash 100.

As shown in FIG. 4, a flash 100 of the present invention includes a substrate 10. Two gate structures 12 are disposed on the substrate 10. Each of the gate structures 12 includes a floating gate 14, a control gate 16 and a hard mask 18. The control gate 16 is disposed on the floating gate 14. The hard mask 18 is disposed on the control gate 16. An erase gate 40 is disposed between the gate structures 12. Two word lines 38 are respectively disposed at a side of each of the gate structures 12 which is opposed to the erase gate 40. That is, one of the word lines 38 is disposed at a side of one of the gate structures 12, and the side of the one of the gate structures 12 is away from the erase gate 40. The other one of the word lines 38 is disposed at a side of the other one of the gate structures 12, and the side of the other one of the gate structures 12 is away from the erase gate 40. A top surface of each of the word lines 38 includes a concave surface 38a and a sharp angle 38b. The sharp angle 38b is closed to a sidewall 46 of the word line 38 where the sharp angle 38b is disposed. The sidewall 46 is away from the gate structures 12 and the shape angle 38b connects to the concave surface 38a. The sharp angle 38b points to a direction away from the substrate 10. The concave surface 38a is lower than a top surface of the gate structures 12. Moreover, each of the word lines 38 of the present invention has a width W. The width W is parallel to a top surface of the substrate 10. The width W of one of the word lines 38 is the same as the width W of the other one of the word lines 38. According to another preferred embodiment of the present invention, the difference between the widths W respectively belonging to the two word lines 38 made by the method of the present invention is smaller than the difference between the widths W respectively belonging to the two word lines defined by photoresist.

Furthermore, a top surface of the erase gate 40 includes a concave surface 48. The concave surface 48 is lower than a top surface of each of the gate structures 12. An insulating layer 22 is disposed between the substrate 10 and the word lines 38, between the substrate 10 and the gate structures 12, between each of the gate structure 12 and the erase gate 40, between the control gate 16 and the floating gate 14 and between one of the two word lines 38 and one of the gate structures 38. A doping region 20 is disposed in the substrate 10 between the gate structures 12. In other words, the doping region 20 is disposed within the substrate 10 directly under the erase gate 40. The doping region 20 serves as a source line of the flash 100. Moreover, two doping regions 44 are respectively disposed in the substrate 10 at one side of each of the word lines 38. Each of the doping regions 44 serves as a bit line of the flash 100. The insulating layer 22 includes silicon oxide, silicon nitride, silicon carbide nitride, silicon oxynitride, silicon carboxynitride. The control gate 16, the erase gate 40 and the word lines 38 include conductive materials such as doped polysilicon. The floating gate 14 includes silicon nitride or polysilicon. The hard mask 18 includes silicon oxide, silicon nitride, silicon carbide nitride, silicon oxynitride, silicon carboxynitride. The substrate 10 includes a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate.

The word lines and the control gate of the present invention are formed by a self-aligned process instead of using a photoresist to define word lines, therefore the photomask for patterning the photoresist can be taken away. Furthermore, the sacrifice layer is used to adjust the etched thickness of the conductive layer. Comparing to an anisotropic etching process performed without a sacrifice layer, the anisotropic etching process performed with a sacrifice layer can control the width of the word line and the thickness of the control gate by adjusting the thickness of the sacrifice layer and the thickness of the conductive layer. On the other hand, the anisotropic etching process performed without a sacrifice layer can only control the width of the word line by adjusting the thickness of the conductive layer. However, by using only one material (conductive layer) to adjust the width of the word line can only vary the width of the word line in the small range. Besides, a word line with a large width needs to be formed by a thicker conductive layer if there is no sacrifice layer. In the present invention, a word line with a large width can be formed by a thinner conductive layer because a sacrifice layer is used. In this way, fabricating cost can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flash comprising:
    a substrate;
    two gate structures disposed on the substrate, each of the two gate structures comprising a floating gate and a control gate, and the control gate being disposed on the floating gate;
    an erase gate disposed between the two gate structures; and
    two word lines disposed on the substrate, wherein one of the two word lines is disposed at a side of one of the two gate structures, and the other one of the two word lines is disposed at a side of the other one of the two gate structures; wherein a top surface of each of the two word lines comprises a first concave surface and a sharp angle, the sharp angle is spaced from a sidewall of the word line, the sidewall is away from the two gate structures and the sharp angle connects to the first concave surface.

2. The flash of claim 1, wherein the sharp angle point to a direction away from the substrate.

3. The flash of claim 1, wherein a top surface of the control gate comprises a second concave surface.

4. The flash of claim 3, wherein the second concave surface is lower than a top surface of each of the two gate structures.

5. The flash of claim 1, wherein the first concave surface is lower than a top surface of each of the two gate structures.

6. The flash of claim 1, further comprising: an insulating layer disposed between the substrate and the two word lines, the substrate and the two gate structures, each of the two gate structure and the erase gate, the control gate and the floating gate and one of the two word lines and one of the two gate structures.

7. The flash of claim 1, further comprising:
    a source line disposed in the substrate directly below the erase gate; and
    two bit lines respectively disposed in the substrate at one side of each of the two word lines.

* * * * *